United States Patent
Ebisawa et al.

(10) Patent No.: US 8,410,689 B2
(45) Date of Patent: Apr. 2, 2013

(54) STACKED BODY HAVING A LIGHT EMITTING ELEMENT AND A LIGHT DETECTING ELEMENT FOR MEASURING AN AMOUNT OF LIGHT, A LIGHT EMITTING DEVICE, AND AN IMAGE FORMATION DEVICE

(75) Inventors: Isao Ebisawa, Hamura (JP); Yoshiyuki Matsuoka, Tokorozawa (JP); Kenji Kobayashi, Hino (JP)

(73) Assignee: Casio Computer Co., Ltd., Tokyo (JP)

( * ) Notice: Subject to any disclaimer, the term of this patent is extended or adjusted under 35 U.S.C. 154(b) by 162 days.

(21) Appl. No.: 12/826,730

(22) Filed: Jun. 30, 2010

(65) Prior Publication Data

US 2010/0327753 A1 Dec. 30, 2010

(30) Foreign Application Priority Data

Jun. 30, 2009 (JP) ................................ 2009-154821
Jun. 30, 2009 (JP) ................................ 2009-154832

(51) Int. Cl.
*H01L 51/50* (2006.01)
*H01L 51/52* (2006.01)
(52) U.S. Cl. .................. 313/506; 313/509; 313/505
(58) Field of Classification Search .......... 313/500–512
See application file for complete search history.

(56) References Cited

U.S. PATENT DOCUMENTS

| 7,504,616 B2 * | 3/2009 | Nakamura et al. .......... 250/214.1 |
| 7,977,126 B2 * | 7/2011 | Lee et al. .......................... 438/24 |
| 2002/0044208 A1 * | 4/2002 | Yamazaki et al. ............. 348/272 |
| 2005/0116616 A1 * | 6/2005 | Koeda ............................ 313/500 |
| 2007/0164293 A1 * | 7/2007 | Hamano et al. ................. 257/79 |

FOREIGN PATENT DOCUMENTS

| JP | 11-138890 A | 5/1999 |
| JP | 2001-085160 A | 3/2001 |
| JP | 2006-058352 A | 3/2006 |
| JP | 2007-283491 A | 11/2007 |

OTHER PUBLICATIONS

Japanese Office Action dated Apr. 19, 2011 (and English translation thereof) in counterpart Japanese Application No. 2009-154832.
Japanese Office Action dated Apr. 19, 2011 (and English translation thereof) in counterpart Japanese Application No. 2009-154821.

* cited by examiner

*Primary Examiner* — Mariceli Santiago
(74) *Attorney, Agent, or Firm* — Holtz, Holtz, Goodman & Chick, P.C.

(57) ABSTRACT

A stacked body comprising a light emitting layer and a light detecting element which detects light emitted by the light emitting layer. The light detecting element has a light detecting region which overlaps a light emitting surface of the light emitting layer as viewed in the thickness direction of the light emitting layer.

9 Claims, 15 Drawing Sheets

STACKED BODY HAVING A LIGHT EMITTING ELEMENT AND A LIGHT DETECTING ELEMENT FOR MEASURING AN AMOUNT OF LIGHT, A LIGHT EMITTING DEVICE, AND AN IMAGE FORMATION DEVICE

CROSS-REFERENCE TO RELATED APPLICATION

This application claims the benefit of Japanese Patent Application No. 2009-154821, filed on Jun. 30, 2009 and Japanese Patent Application No. 2009-154832, filed on Jun. 30, 2009, the entire disclosure of which is incorporated by reference herein.

FIELD

The present invention relates to a stacked body, a light emitting device, and an image formation device.

BACKGROUND

Disclosed as an example of this kind of technology in Unexamined Japanese Patent Application KOKAI Publication No. H11-138890 is a drive control device which comprises a buffer memory that stores correction data for correcting a emitted light amount of an LED, output control means that reads the correction data from the buffer memory and outputs the read data to a driver circuit together with image data for activation/deactivation of the LED, and LED driving means that drives LEDs by what corresponds to a number larger than the number of outputs by the driver circuit in accordance with the correction data and the image data both input in the driver circuit.

However, the foregoing patent literature does not disclose a configuration which can efficiently measure an emitted light amount of a light emitting element (in particular, a light emitting layer). There is thus a demand for efficient measurement of an emitted light amount of a light emitting layer when measuring the same.

The present invention has been made in view of the foregoing circumstance, and it is an object of the present invention to accomplish efficient measurement of an emitted light amount of a light emitting layer.

SUMMARY

A stacked body according to a first aspect of the present invention comprises a light emitting layer and a light detecting element which detects light emitted by the light emitting layer. The light detecting element includes a light detecting region which overlaps a light emitting surface of the light emitting layer as viewed in the thickness direction of the light emitting layer.

The stacked body may further comprise: a transmissive part through which some of light emitted by the light emitting element passes; and a light blocking part which blocks some of light emitted by the light emitting element, and wherein the light emitting surface may be formed in a shape having a dimension in a first direction in the light emitting surface longer than a dimension in a second direction, the second direction being perpendicular to the first direction, and the light detection region and the transmissive part may be arranged in the first direction as viewed in the thickness direction of the light emitting layer.

The light detection region may overlap the light blocking part as viewed in the thickness direction of the light emitting layer, but not overlap the transmissive part.

The light blocking part may comprise a source electrode, a drain electrode, and a gate electrode of the light detecting element.

The stacked body may further comprise an electrode layer which is for causing the light emitting layer to emit light and which is provided between the light emitting layer and the light detecting element, wherein the electrode layer may function as a second gate electrode of the light detecting element.

The stacked body may comprise the plurality of light emitting layers and the plurality of light detecting elements for each of the light emitting layers, wherein a drain electrode, a source electrode, and a gate electrode of at least one light detecting element may be electrically connected to a drain electrode, a source electrode, and a gate electrode of another light detecting element, respectively.

The stacked body may comprise the plurality of light emitting elements and the one light emitting element for the plurality of light emitting elements.

The light detecting element may output an electric signal corresponding to an emitted light amount of the light emitting element.

The stacked body may comprise a control unit, and wherein the light detecting element may output an electric signal corresponding to an emitted light amount of the light emitting element, and the control unit may correct a supply current to the light emitting element based on the electric signal output by the light detecting element to control a luminescence intensity of the light emitting element.

A light emitting device according to a second aspect of the present invention comprises the above-explained stacked body.

An image formation device according to a third aspect of the present invention comprises the above-explained stacked body.

A light emitting device according to a fourth aspect of the present invention comprises: a light emitting element including an electrode; and a light detecting element for detecting light emitted by the light emitting element, and wherein the light detecting element may include two gate electrodes, and one of the two gate electrodes may be an electrode possessed by the light emitting element.

The light emitting element and the light detecting element may be both formed in a stacked body.

Another electrode of the two gate electrodes may block some of light emitted by the light emitting element.

The light detecting element may include a light detecting region which overlaps a light emitting surface of a light emitting layer of the light emitting element as viewed in a thickness direction of the light emitting layer of the light emitting element.

The light emitting device may comprise the plurality of light detecting elements, wherein respective gate electrodes, respective source electrodes, and respective drain electrodes of individual light detecting elements may be electrically connected together.

The light emitting device may comprise the plurality of light emitting elements, and the one light detecting element for the plurality of light emitting elements.

The light detecting element may output an electric signal corresponding to an emitted light amount of the light emitting element.

The light emitting device may comprise a control unit, and wherein the light detecting element may output an electric signal corresponding to an emitted light amount of the light emitting element, and the control unit may correct a supply current to the light emitting element based on the electric signal output by the light detecting element to control a luminescence intensity of the light emitting element.

An image formation device according to a fifth aspect of the present invention comprises the above-explained light emitting device.

BRIEF DESCRIPTION OF THE DRAWINGS

A more complete understanding of this application can be obtained when the following detailed description is considered in conjunction with the following drawings, in which.

DETAILED DESCRIPTION

Embodiments of the present invention will now be explained with reference to the accompanying drawings. It should be understood that the present invention is not limited to the following embodiments and the drawings. The present invention can be changed and modified in various forms without departing from the scope and the spirit of the present invention.

The following explanation will be given of embodiments in which a light emitting element is an organic EL (organic Electro-Luminescence) element, but the light emitting element may be other light emitting elements (e.g., an LED (Light Emitting Diode)). Note that an organic EL element may be called an OLED (Organic Light Emitting Diode) or an LEP (Light Emitting Polymer) in some cases. Moreover, a stacked body in each of the following embodiments is used for a light emitting device. A light emitting device is, for example, an exposure device (an exposure head). Moreover, the light emitting device is used for an image formation device (e.g., a printer, or an electrophotographic device). The applications of the stacked body and the light emitting device of the present invention are not limited to the foregoing applications. In order to facilitate understanding for the principle of the present invention, the explanation will be given of embodiments in which the image formation device generates a black-and-white image, but the image formation device may generate a color image. An example of image formation device which generates a color image is a tandem image formation device. In this case, the image formation device has plural light emitting devices (for black, cyan, magenta, and yellow) and a photo-conductor drum, etc. Each light emitting device and a photo-conductor drum have substantially same structures as those of the following embodiments. Furthermore, a lighting circuit to be discussed later may be a lighting circuit of any arbitrary scheme, such as an active scheme/passive scheme, and constant-voltage writing/constant-current writing.

First Embodiment

Figure 1:
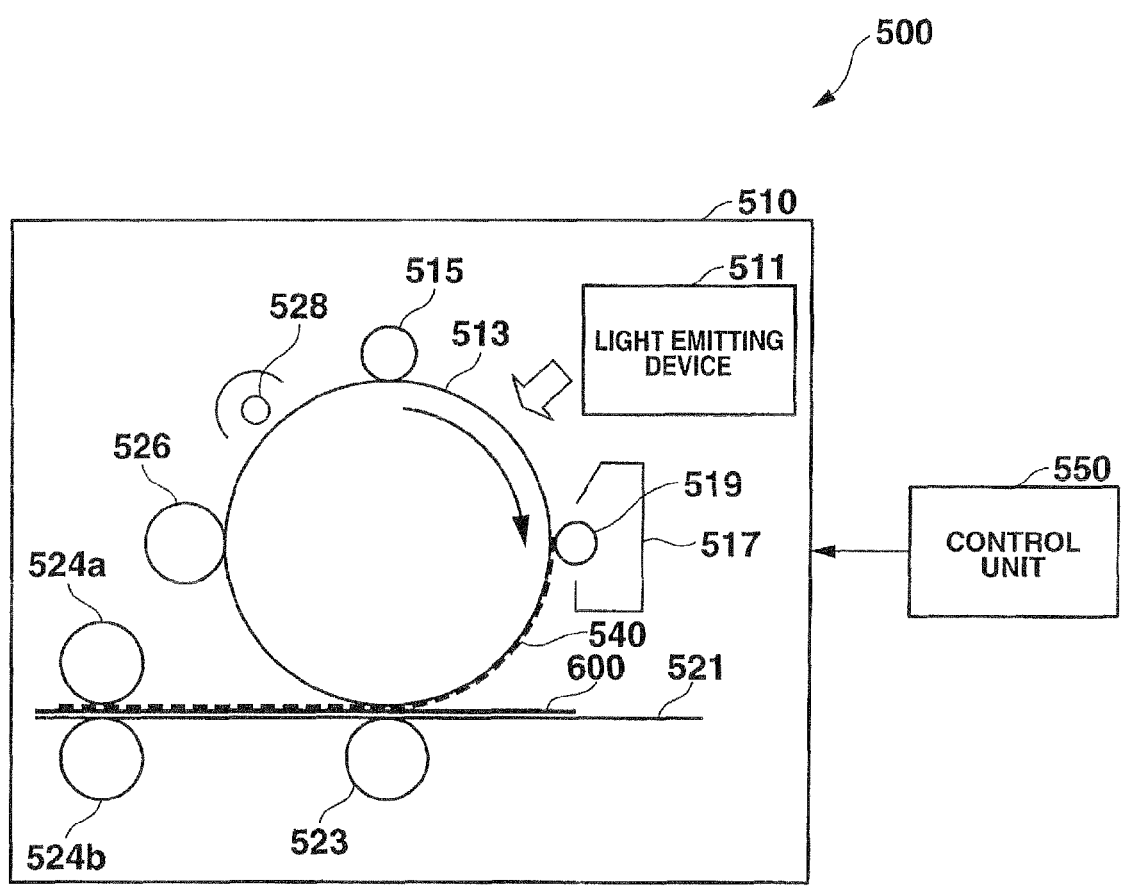
FIG. 1 is a diagram showing a general configuration of an image formation device according to a first embodiment of the present invention.

As shown in FIG. 1, an image formation device 500 comprises an image formation unit 510 and a control unit The control unit 550 controls the image formation unit 510. Under the control of the control unit 550, the image formation unit 510 generates a letter or an image on a paper 600. The control unit 550 includes a CPU (Central Processing Unit), a ROM (Read Only Memory), a RAM (Random Access Memory), and the like, although those are not illustrated.

The image formation unit 510 includes a light emitting device (exposure head) 511, a photo-conductor drum 513, a electrifying roller 515, a processing machine 517, a processing roller 519, a conveying belt 521, a transfer roller 523, fuser rollers 524a and 524b, a cleaning machine 526, and an eraser light source 528.

The photo-conductor drum 513 is for forming a static latent image by charging, is driven by a driving unit (not illustrated), and rotates around a shaft in a direction of an arrow. The photo-conductor drum 513 comprises a negative electrified OPC (Organic Photo Conductor).

The electrifying roller 515 causes the photo-conductor drum 513 to be electrified uniformly. The electrifying roller 515 is a negative electrification device to which a negative voltage is applied from an electrification power source (not illustrated), and which causes the skin surface of the photo-conductor drum 513 to be negatively electrified uniformly, thereby electrically initializing it.

The light emitting device 511 performs optical writing (exposure) on the electrified photo-conductor drum 513, and forms a static latent image on the photo-conductor drum 513 by optical writing.

The light emitting device 511 includes a light emitting element (an organic EL element), and a light detecting element. The light detecting element outputs an electric signal corresponding to an emitted light amount of light emitted by the light emitting element. The control unit 550 corrects a supply current or the like to the light emitting element based on the electric signal output by the light detecting element, thereby controlling the emission intensity of the light emitting element. Such a control is performed through conventionally-well-known technologies. The time degradation of the emitted light amount of the light emitting element is thus corrected through such a control to maintain the emitted light amount of the light emitting element constant.

The processing machine 517 retains a toner inside. The processing roller 519 rotatingly conveys the toner retained in the processing machine 517 to a facing part with the photo-conductor drum 513. The processing roller 519 receives a processing bias which is applied from a processing-bias power source (not illustrated). The processing roller 519 causes the toner retained in the processing machine 517 to adhere to the processing roller 519, and rotatingly conveys the adhering toner to the photo-conductor drum 513.

As the processing roller 519 conveys the toner to the facing part with the photo-conductor drum 513, the toner is transferred to the electrified photo-conductor drum 513, so that a toner image 540 is formed. The toner adhering amount (the concentration of a processed image) of the toner image 540 is set based on an exposure amount on the photo-conductor drum 513.

The convey belt 521 causes the paper 600 disposed thereon to be conveyed. The transfer roller 523 is for transferring the toner image 540 formed on the photo-conductor drum 513 to the paper 600, and is arranged below the photo-conductor drum 513.

The fuser rollers 524a and 524b cause the toner image 540 to be thermally fused on the paper 600, and eject the thermally-fused paper 600 out of the image formation device 500. The cleaning machine 526 eliminates an untransferred toner remaining on the photo-conductor drum 513. The eraser light source 528 causes the surface of the photo-conductor drum 513 to be neutralized uniformly.

The photo-conductor drum 513 is electrified by the electrifying roller 515 while rotating. The light emitting device 511 performs optical writing on the electrified photo-conductor drum 513 to form a static latent image on the photo-conductor drum 513. The processing roller 519 causes the toner retained in the processing machine 517 to adhere to the processing roller 519, and rotatingly conveys the adhering toner to the photo-conductor drum 513. Accordingly, the toner is transferred on the electrified photo-conductor drum 513 and the toner image 540 is formed. Conversely, the paper 600 is conveyed by the conveying belt 521. The toner image 540 formed on the photo-conductor drum 513 is transferred on the paper 600 by the transfer roller 523. The fuser rollers 524a and 524b cause the toner image 540 to be thermally fused on the paper 600, and eject the paper 600 having undergone thermal fusing out of the image formation device 500. The cleaning machine 526 eliminates the untransferred toner remaining on the photo-conductor drum 513. The eraser light source 528 causes the surface of the photo-conductor drum 513 to be neutralized uniformly.

In the foregoing printing process, the control unit 550 temporarily stores image data D_image supplied externally by using a raster image processor (not illustrated) possessed by the control unit 550. Moreover, data on a paper size, etc., is also externally supplied to the control unit 550. The control unit 550 generates a horizontal control signal/HSYNC, a vertical control signal/VSYNC, and a control signal S_print in accordance with the supplied data and a conveying speed set beforehand. Note that the horizontal control signal/HSYNC is a synchronization signal in the main scanning direction of the image formation device 500. The control unit 550 supplies image data D_image to the image formation unit 510, and also supplies the generated control signals to the image formation unit 510.

Figure 2:
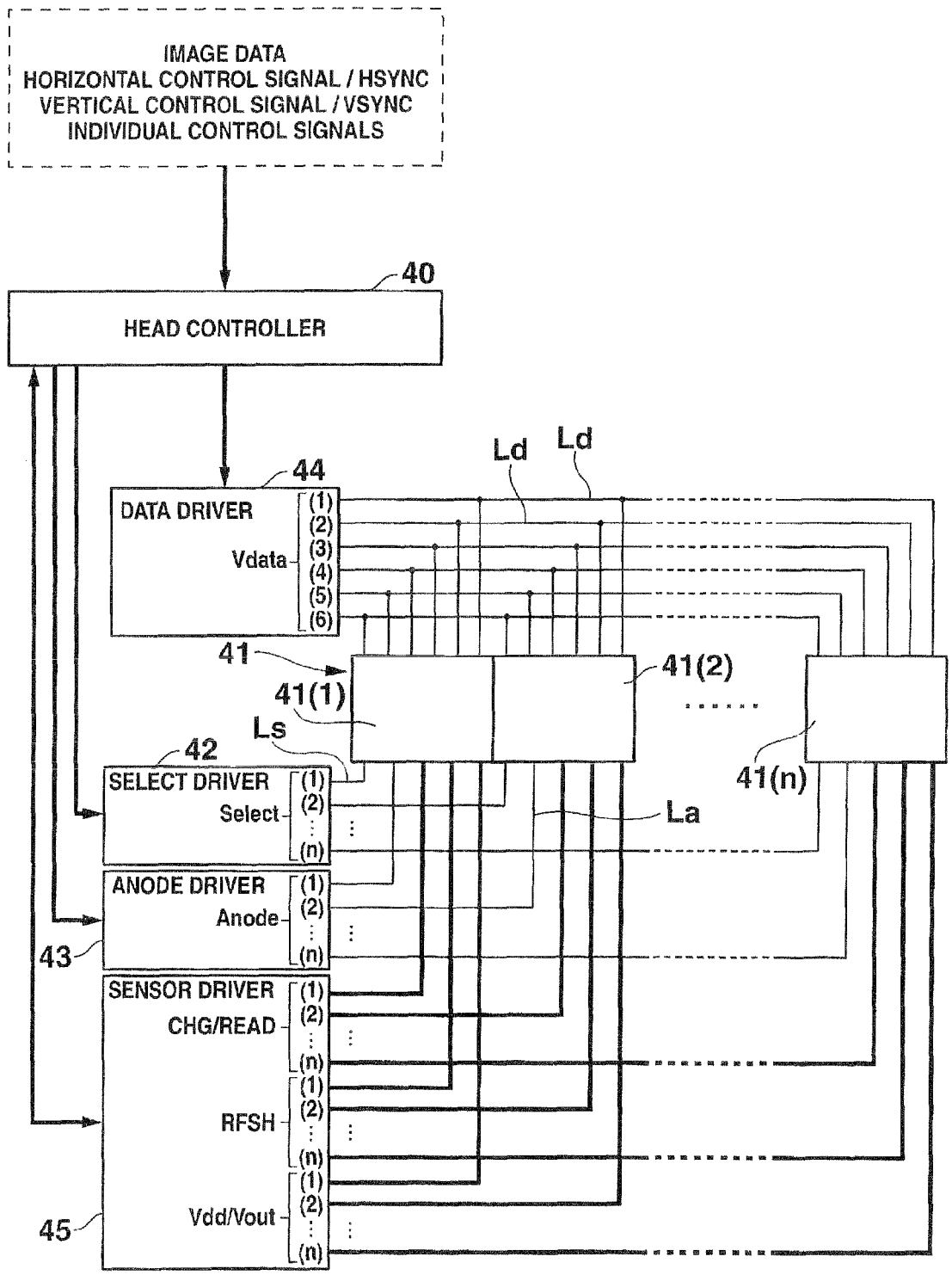
FIG. 2 is a diagram showing a general configuration of a light emitting device according to the first embodiment of the present invention.

As shown in FIG. 2, the light emitting device 511 comprises a head controller 40, an organic EL panel 41, a select driver 42, an anode driver 43, a data driver 44, and a sensor driver 45. The light emitting device 511 also comprises a non-illustrated lens array, etc. The lens array forms an image from luminous fluxes from the organic EL panel. Note that the head controller 40 comprises a CPU, a ROM, a RAM, etc.

Figure 3:
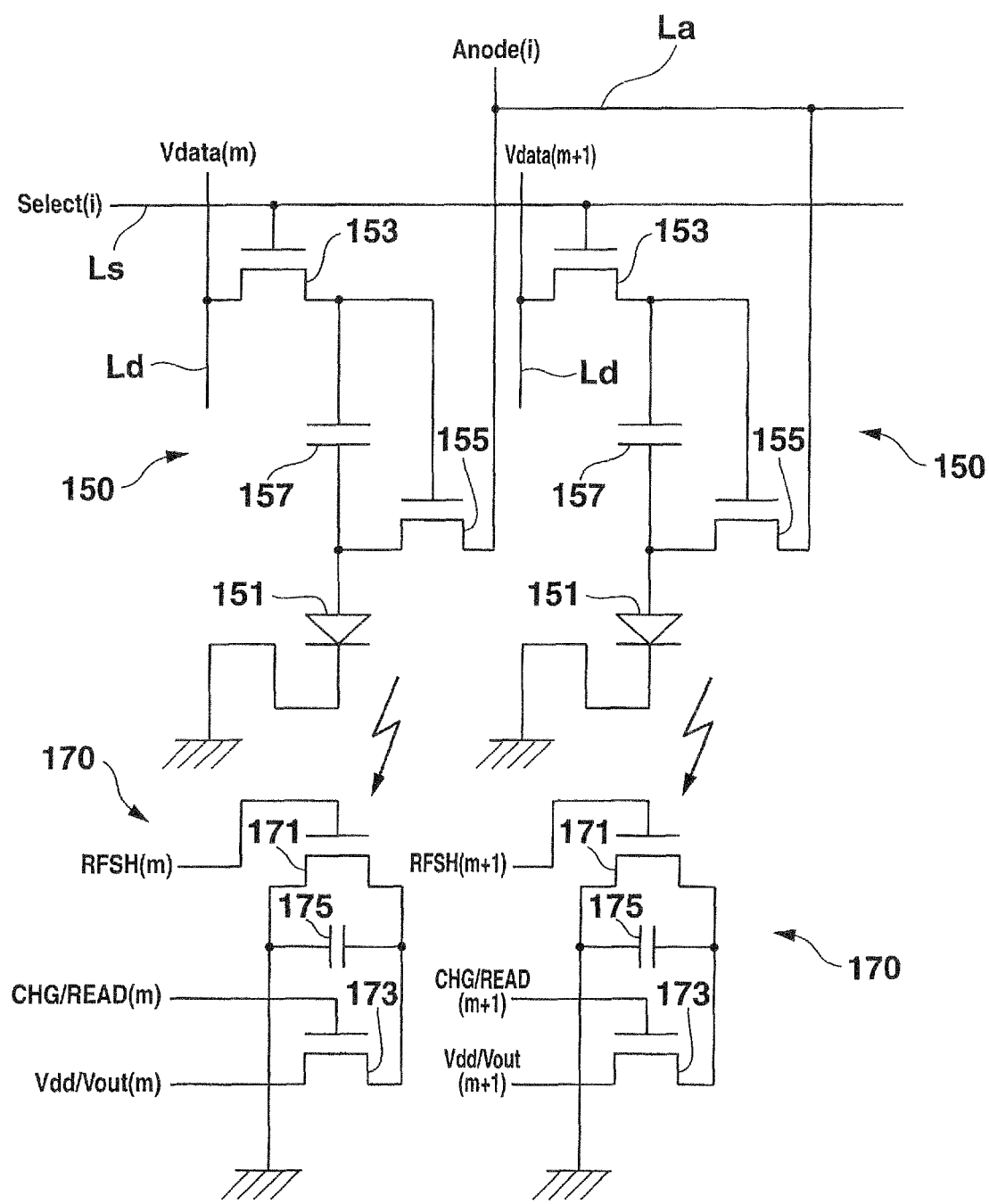
FIG. 3 is an equivalent circuit diagram for a major part of the light emitting device according to the first embodiment of the present invention.

The organic EL panel 41 includes plural (n number of) cells 41(1, 2, 3, to n). n is a natural number. As shown in FIG. 3, each cell 41(1, 2, 3, to n) includes a plural pairs of light emitting units 150 and optical sensors 170. In the embodiment, each cell 41(1, 2, 3 to n) includes six pairs of light emitting units 150 and the optical sensors 170. The number of pairs of the light emitting units 150 and the optical sensors 170 in each cell 41(i) can be set arbitrary. i is any number among 1 to n. Note that FIG. 3 shows partial light emitting units 150 and optical sensors 170 of a cell 41(i), but the configuration of each light emitting unit 150 and that of each optical sensor 170 are common.

The light emitting unit 150 is a lighting circuit. The light emitting unit 150 includes organic EL elements 151, selecting TFTs 153, driving TFTs 155, and hold capacitors 157.

The organic EL element 151 is a light emitting element having a structure that an anode electrode, an organic EL layer, a cathode electrode are stacked together, and the cathode electrode is grounded. Moreover, the anode electrode is connected to the source of the driving TFT 155.

The selecting TFT 153 is a transistor which functions as a switch of selecting an organic EL element 151 to be caused to emit light. The selecting TFT 153 has the drain connected to a data line Ld, has the source connected to the gate of the driving TFT 155 and the hold capacitor 157, and has the gate connected to a select line Ls.

The driving TFT 155 is a transistor for driving the organic EL element 151, has the drain connected to an anode line La, and has the source connected to the anode electrode of the organic EL element 151.

The hold capacitor 157 is for holding a gate-source voltage of the driving TFT 155, and is connected between the gate of the driving TFT 155 and the source thereof.

Light emitted by a light emitting unit 150 corresponds to a pixel of an image. The light emitting unit 150 may include a resetting transistor (not illustrated). This transistor is for resetting the voltage level of the data line Ld, has the drain connected to the data line Ld, and has the source grounded. As a reset signal Reset of a High level is applied from, for example, the data driver 44, such a transistor turns on, and resets the voltage level of the data line Ld.

The optical sensor 170 is an optical sensor circuit which measures an emitted light amount of the organic EL element 151 subjected to measurement. An emitted light amount is a product of an emission intensity of the organic EL element 151 per unit area by a light emitting time.

The optical sensor 170 outputs a signal Vout corresponding to the emitted light amount of the organic EL element 151 subjected to measurement. The optical sensor 170 comprises optical sensor TFTs 171, charging-readout TFTs 173, and capacitors 175.

The optical sensor TFT 171 is a transistor for detecting light, and has the drain connected to the source of the charging-readout TFT 173. The optical sensor TFT 171 also has the source grounded. Furthermore, the optical sensor TFT 171 has the gate to which a refresh signal RFSH is supplied. As a refresh signal RFSH of a High level equal to a threshold voltage or higher is applied, the optical sensor TFT 171 turns on.

The optical sensor TFT 171 turns off as the refresh signal RFSH becomes a Low level. As irradiated with light, the optical sensor TFT 171 has a channel formed between the drain and the source, and a drain current corresponding to the emitted light amount of the organic EL element 151 flows through that channel.

The charging-readout TFT 173 is for charging, has the source connected to the drain of the optical sensor TFT 171, and has the drain connected to Vdd/Vout. The gate of the charging-readout TFT 173 is connected to CHG/READ.

The capacitor 175 is for holding a dark current, and has both ends connected to the drain of the optical sensor TFT 171 and the source thereof, respectively. The capacitor 175 is charged as the charging-readout TFT 173 is in an on state, and is discharged as the drain current flows through the optical sensor TFT 171.

Note that the above-explained TFTs are each a Thin Film Transistor comprised of an n-channel type FET (Field Effect Transistor).

The select driver 42 is for selecting a cell 41(*i*). The select driver 42 receives a timing signal supplied from the head controller 40, and generates a cell selecting signal Select(1) to Select(n) of a High level for selecting a cell 41(*i*) on the basis of the timing signal.

The select driver 42 successively outputs the generated cell selecting signals Select(1) to Select(n) of a High level to corresponding select lines Ls in the order from 1 to n, and successively selects the cells 41(1) to 41(*n*).

The anode driver 43 successively applies anode signals Anode(1) to Anode(n) with a voltage VH set to, for example, +15 V to respective cells 41(1) to 41(*n*) through anode lines La in order to cause respective organic EL elements to emit light.

The anode driver 43 receives a timing signal supplied from the head controller 40, and generates the anode signals Anode (1) to Anode(n).

Subsequently, the anode driver 43 successively outputs the anode signals Anode(i) with the voltage VH to respective anode lines La, thereby causing the respective organic EL elements in a cell 41(*i*) selected by the select driver 42 to emit light. Which organic EL element in a cell 41(*i*) is caused to emit light depends on tone signals Vdata(1) to Vdata(6) supplied from the data driver 44.

The data driver 44 writes the tone signals Vdata(1) to Vdata(6) supplied from the head controller 40 in respective hold capacitors 157 selected by the select driver 42.

For example, as the select driver 42 outputs a select signal Select(1) of a High level and the anode driver 43 outputs an anode signal Anode(1) with the voltage VH so that the cell 41(1) is selected, the data driver 44 outputs the tone signals Vdata(1) to Vdata(6) to respective data lines Ld. In this fashion, the data driver 44 writes the tone signals Vdata(1) to Vdata(6) in respective hold capacitors 157 of the cell 41(1) selected by the select driver 42.

More specifically, as the select driver 42 outputs the signal Select(1) of a High level to the select line Ls, the selecting TFT 153 turns on. As the tone signal Vdata(1) is supplied to the light emitting unit 150, a tone current Idata(1) flows from the data driver 44 through the gate of the driving TFT 155 and the hold capacitor 157, and a signal charge corresponding to the tone signal Vdata(1) is written in the hold capacitor 157.

In this fashion, signal charges corresponding to tone signals Vdata(1) to Vdata(6) are written in respective hold capacitors 157.

As the anode driver 43 outputs the anode signal Anode(1) with the voltage VH to the anode line La, the driving TFT 155 supplies a current Ie corresponding to the signal charge written in the hold capacitor 157 in the cell 41(1). Each organic EL element 151 emits light at a brightness corresponding to the supplied current Ie. As the select driver 42 causes the signal Select(1) to fall down, the selecting TFT 153 turns off. Even though the selecting TFT 153 turns off, the hold capacitor 157 still holds a gate voltage of the driving TFT 155, the driving TFT 155 supplies the current Ie corresponding to the signal charge written in the hold capacitor 157 to the organic EL element 151, and the organic EL element 151 keeps emitting light at a brightness corresponding to the supplied current Ie.

Note that a period that the anode signal Anode(1) with the voltage VH is being supplied is a light emitting period of the organic EL element, and is an anode time.

The select driver 42, the anode driver 43, and the data driver 44 cause the organic EL elements to emit light one by one when the emitted light amount of the organic EL element is measured.

The sensor driver 45 drives/controls each optical detection element of the organic EL panel 41. The sensor driver 45 receives a timing signal supplied from the head controller 40, generates a control signal CHG/READ(i), a refresh signal RFSH(i), and a charge signal Vdd(i), and supplies those generated signals to the organic EL panel 41 thereby driving the optical sensor. The control signal CHG/READ(i), the refresh signal RFSH(i), and the charge signal Vdd(i) are each six signals corresponding to the six optical sensors 170 of a cell 41(*i*), and each signal is supplied to each optical sensor 170. That is, there is only one line interconnecting the sensor driver 45 and each cell 41(*i*) together in FIG. 2, but there are six lines in reality.

The sensor driver 45 detects Vout(i) output by the optical sensor 170. The detected Vout(i) is, for example, amplified by a certain circuit in the sensor driver 45, and the amplified Vout(i) is output to the head controller 40. Note that the Vout(i) is each six signals corresponding to the six optical sensors 170 of a cell 41(*i*), and each signal is supplied to each sensor driver 45. That is, there is only one line interconnecting the sensor driver 45 and each cell 41(*i*) together in FIG. 2, but there are six lines in reality.

As the refresh signal RFSH of a High level is supplied to the optical sensor 170, the optical sensor TFT 171 turns on, and a charge remaining in the capacitor 175 is released, and the capacitor 175 is refreshed. Next, the refresh signal RFSH is set to be a Low level to turn off the optical sensor TFT 171.

Figure 4:
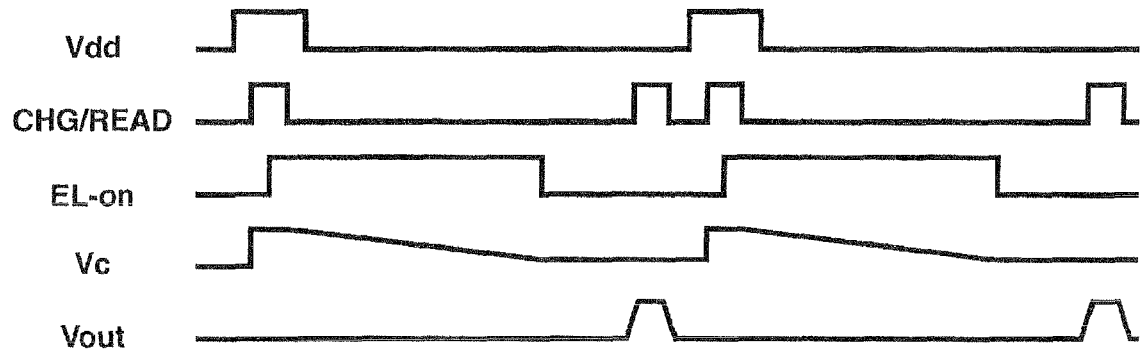
FIG. 4 is a timing chart showing a light detecting operation by the light emitting device according to the first embodiment of the present invention.

Thereafter, as shown in FIG. 4, a charge signal Vdd and the control signal CHG/READ both of which are a High level are supplied to the optical sensor 170. Together with this signal supply, the charging-readout TFT 173 turns on, and the capacitor 175 is charged at a voltage corresponding to Vdd. Accordingly, an electric potential Vc increases. Moreover, the charging-readout TFT 173 turns off thereafter. Conversely, a current is supplied to the organic EL element 151 so that the organic EL element 151 emits light. At this time, when irradiated with light, the optical sensor TFT 171 has a channel formed between the drain and the source, a drain current corresponding to the emitted light amount of the organic EL element 151 flows through such a channel, and the electric potential Vc gradually decreases. After a predetermined time, the control signal CHG/READ of a High level is supplied to the charging-readout TFT 173, the charging-readout TFT 173 turns on again, and Vout is output. The emitted light amount of the light emitting unit 150 can be achieved from the Vout. When Vout is little or zero, the emitted light amount is large, and when Vout is large, the emitted light amount is little. Thus way, the optical sensor 170 can detect light from the organic EL element 151, and more specifically, can measure the emitted light amount of the organic EL element 151.

Figure 5:
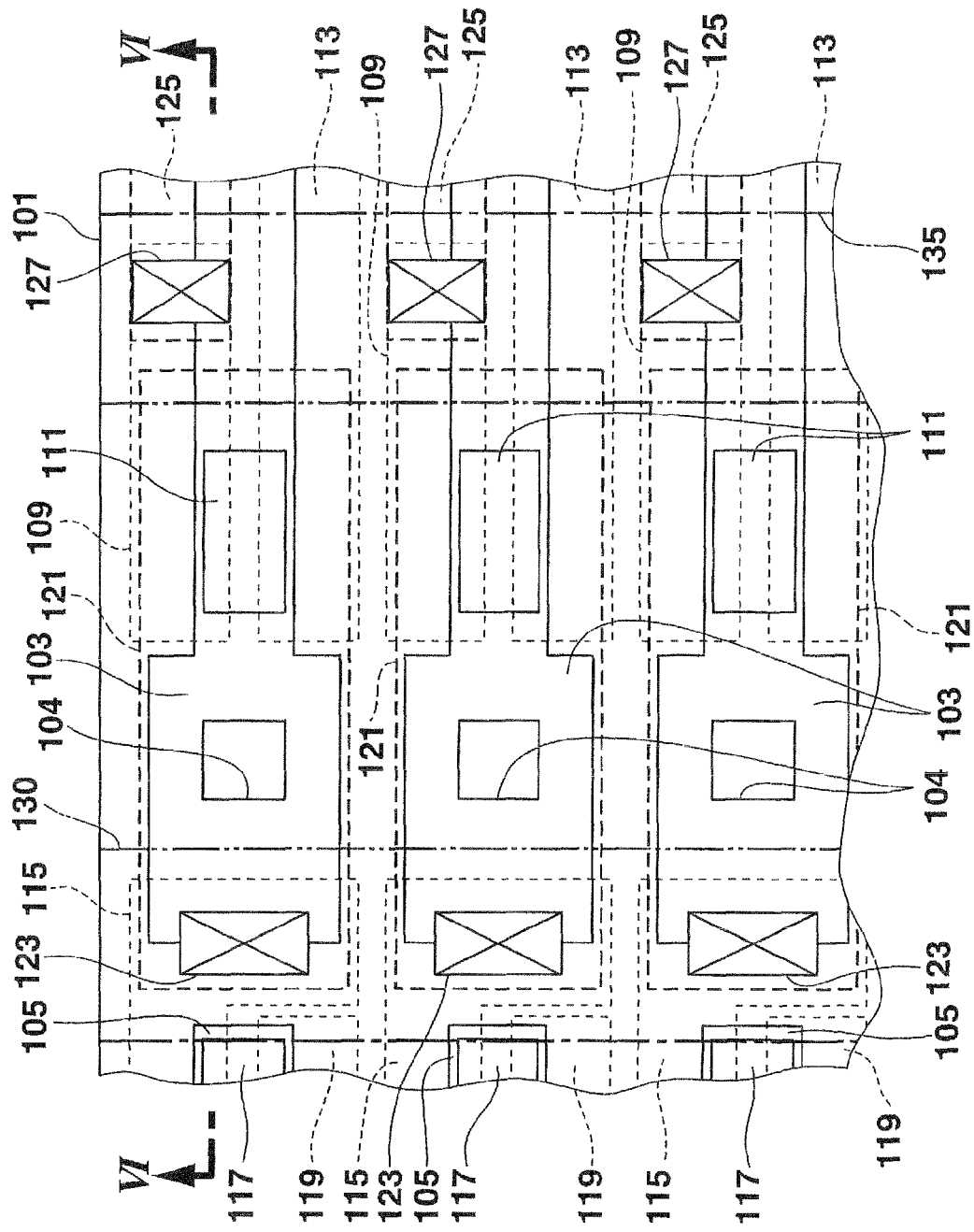
FIG. 5 is a schematic diagram showing a major part for explaining a structure of a stacked body according to the first embodiment of the present invention.
Figure 6:
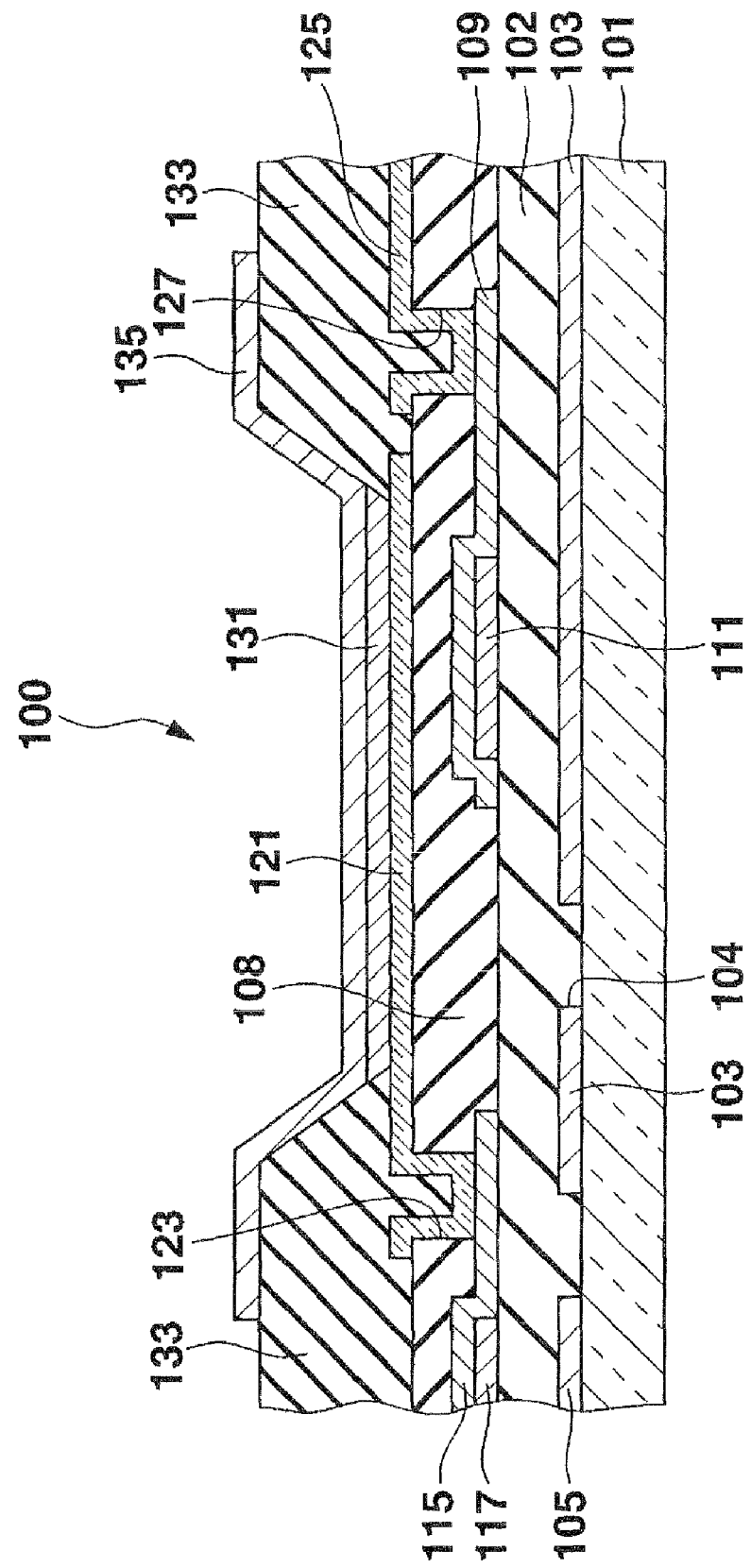
FIG. 6 is a schematic cross-sectional view showing a major part for explaining the structure of the stacked body according to the first embodiment.

As shown in FIGS. 5 and 6, the light emitting device 511 has a stacked body 100. Note that FIG. 6 is a cross-sectional view along a line VI-VI in FIG. 5. The stacked body 100 is formed on a transparent substrate 101. The organic EL panel 41 includes the stacked body 100 and the transparent substrate 101. The stacked body 100 comprises a gate electrode layer 103, a transmissive part 104, a first insulating layer 102, a second insulating layer 108, a source electrode layer 109, a semiconductor layer 111, a drain electrode layer 113, an anode electrode 121, a contact part 123, a source extension electrode 125, a contact part 127, an organic EL layer 131, a bank 133, and a cathode electrode 135.

The gate electrode 103, the first insulating layer 102, the source electrode layer 109, the semiconductor layer 111, and the drain electrode layer 113 form the optical sensor TFT 171. The anode electrode 121, the organic EL layer 131, and the cathode electrode 135 form the organic EL element. The stacked body 100 further has a gate electrode layer 105, a source electrode layer 115, a semiconductor layer 117, a drain electrode layer 119, etc. The first insulating layer 102, the gate electrode layer 105, the source electrode layer 115, the semiconductor layer 117, and the drain electrode layer 119 form the driving TFT 155. The stacked body 100 yet further has respective parts of the selecting TFT 153, the charging-readout TFT 173, the hold capacitor 157, the capacitor 175, and individual lines (Ls, Ld, and La). The electrode layers, the semiconductor layers, etc., forming those structural elements are formed in the same manner as those of the optical sensor TFT 171. Moreover, the electrode layer is electrically connected through the contact part appropriately. The stacked body 100 realizes the circuit shown in FIG. 3 in this fashion. Note that the semiconductor layer, the gate electrode layer, and the source electrode layer of each TFT, electrode layers of each capacitor, and electrode layers (conductive layers) of each line all included in the stacked body 100 are formed through the same process of forming the gate electrode layer 103, the source electrode layer 109, and the semiconductor layer 111, so that the following explanation will be focused on the gate electrode 103, the source electrode 109, and the semiconductor layer 111, and duplicated explanation for the semiconductor layer, the gate electrode layer and the source electrode layer of each TFT will be skipped.

The transparent substrate 101 is an insulating (colorless or colored) transparent substrate. The transparent substrate 101 is, for example, a glass substrate.

The gate electrode layer 103 is formed of a material having a conductive property, such as an Mo film, a Cr film, an Al film, a Cr/Al stacked film, an AlTi alloy film, an AlNdTi alloy film, or an MoNb alloy film, and is formed on the transparent substrate 101.

The first insulating layer 102 (gate insulating film) is formed of an insulating material, e.g., SiN, and is so formed as to cover the transparent substrate 101 and the gate electrode layer 103. The first insulating layer 102 (gate insulating film) is transparent.

The semiconductor layer 111 includes a microcrystal silicon film (semiconductor film). The semiconductor layer 111 is formed on the first insulating layer 102. Moreover, the semiconductor layer 111 has a stopper film (transparent) formed on an upper surface (a surface opposite to the transparent substrate 101) thereof as needed. The stopper film is formed on the upper surface of the semiconductor film. The stopper film is formed of an insulating material, e.g., SiN. It is desirable that the stopper film should be transparent.

The semiconductor layer 111 may have not only a single layer formed of microcrystal silicon, but also two layers of the microcrystal silicon and amorphous silicon stacked together. It is desirable that the thickness of the amorphous silicon film should be set to 10 to 50 nm in order to ease concavities and convexities of the surface of the microcrystal silicon film and to obtain a good contact face.

The source electrode layer 109 and the drain electrode layer 113 are so formed as to partially cover the semiconductor layer 111. The source electrode layer 109 and the drain electrode layer 113 are each formed of a conductive layer, such as AlTi/Cr, AlNdTi/Cr or Cr.

The source electrode layer 109 may have a source region formed between the conductive layer and the semiconductor layer 111, i.e., below the conductive layer. The drain electrode layer 113 may also have a drain region formed between the conductive layer and the semiconductor layer 111, i.e., below the conductive layer. The source region and the drain region are each formed of doped amorphous silicon.

After the stopper film is formed on the semiconductor film (after the semiconductor layer 111 is formed), amorphous silicon layers which will be the source region and the drain region and respective conductive layers of the source electrode layer 109 and the drain electrode layer 113 are formed, and then the optical sensor TFT 171 is formed by etching. Accordingly, the conductive layer of the source electrode layer 109 and the source region thereof are so formed as to have a substantially same shape (a shape as viewed from the thickness direction of the organic EL element). Moreover, the conductive layer of the drain electrode layer 113 and the drain region thereof are so formed as to have a substantially same shape (a shape as viewed from the thickness direction of the organic EL element). The present invention is, however, not limited to this configuration, and for example, an amorphous silicon layer may be formed after a stopper film is formed on a semiconductor film, may be subjected to etching to form a metal film, and such metal film may be subjected to etching so as to be the conductive layer of the source electrode layer 109 or that of the drain electrode layer 113.

The second insulating layer 108 (gate insulating film) is formed of an insulating material, e.g., SiN, and is so formed as to cover the source electrode layer 109, the drain electrode layer 113, and the semiconductor layer 111. The second insulating layer 108 is transparent.

The anode electrode 121 is formed of a translucent and conductive material, such as ITO (Indium Tin Oxide) or ZnO. The anode electrode 121 is electrically connected to the source electrode layer 115 through the contact part 123. The contact part 123 is comprised of an electrode connected to the anode electrode 121, integrally formed with the anode electrode 121, and buried in a through-hole formed in the second insulating layer 108.

The source extension electrode 125 is formed of a translucent and conductive material, such as ITO (Indium Tin Oxide) or ZnO. The source extension electrode 125 is electrically connected to the source electrode layer 109 through the contact part 127. The source extension electrode 125 is also connected to the exterior. The contact part 127 is comprised of an electrode connected to the source extension electrode 125, integrally formed with the source extension electrode 125, and buried in a through-hole formed in the second insulating layer 108.

Formed on the second insulating layer 108 is the bank 133 so as to cover the anode electrode 121 and a part of the source extension electrode 125. The bank 133 is formed of an insulating material, e.g., a hardened photosensitive resin like polyimide. Two lines of banks 133 are formed along the main scanning direction. The organic EL layer 131 is formed between those banks 133 along the main scanning direction.

The organic EL layer 131 is a light emitting layer, and is a layer having a hole-injection layer, an interlayer, and a light emitting film all stacked together in this order beginning from the substrate side. It is fine if the light emitting layer has at least a light emitting film. The hole-injection layer, the interlayer, and the light emitting film function as a carrier transport layer where electrons and holes are transported as carriers.

The hole-injection layer is formed on the second insulating layer 108 and the anode electrode 121, and has a function of supplying holes to the light emitting layer. The hole-injection layer is formed of an organic and high-polymer material which enables injection and transportation of holes. An example of an organic-and-high-polymer-compound containing liquid including injection and transportation of holes is PEDOT/PSS aqueous solution which is a dispersion liquid having polyethylene dioxythiophene (PEDOT) that is a conductive polymer and polystyrene sulfo acid (PSS) that is a dopant both dispersed in a water solvent.

The interlayer is formed on the hole-injection layer. The interlayer has a function of suppressing any hole-injection property of the hole-injection layer, and of facilitating recombination of an electron with a hole in the light emitting layer. The interlayer is provided in order to increase the light emission efficiency of the light emitting layer.

The light emitting layer is formed on the interlayer. The light emitting layer has a function of generating light as a voltage is applied across the anode electrode and the cathode electrode. The light emitting layer is formed of a conventionally-well-known high-polymer light emitting material which can emit fluorescent light or phosphorescent light, e.g., a light emitting material containing a conjugated double-bonded polymer like polyparaphenylenevinylenes or polyfluorenes. Those light emitting materials are formed by applying a solution (dispersion liquid) dissolved (or dispersed) in a water solvent or an organic solvent, such as tetralin, tetramethylbenzene, mesitylene, or xylene, through a nozzle coating or ink jetting technique, and by causing the solvent to vaporize.

The cathode electrode is provided at the light emitting layer side, and has a stacked structure including an electron-injection lower layer formed of a conductive material with a low work function, such as Li, Mg, Ca, or Ba, and an upper layer formed of a light reflective and conductive metal like Al.

Next, an explanation will be given of how to form the stacked body 100.

First, a gate electrode layer is formed on the transparent substrate 101 by, for example, sputtering or vapor deposition, and is patterned to a shape of the gate electrode 103 or the like. Next, the first insulating layer 102 is formed by CVD (chemical Vapor Deposition) or the like so as to cover the gate electrode layer 103 and the like.

Next, a semiconductor film (microcrystal silicon film) is formed on the first insulating layer 102 by CVD or the like. At this time, the microcrystal silicon film may be a so-called as depo μc-Si which poly-crystallizes at the time of film formation, or may be formed by forming amorphous silicon, and by performing annealing thereon to cause the amorphous silicon to be poly-crystallized. When a two-layer structure of microcrystal silicon and amorphous silicon is employed, in order to suppress any formation of unnecessary level at a boundary surface, it is preferable that microcrystal silicon should be as depo μc-Si, and amorphous silicon should be subjected to successive film formation using the same device as that of microcrystal silicon.

Subsequently, nitride silicon is formed on the microcrystal silicon film by CVD or the like. Next, a resist is formed on the nitride silicon, is exposed through a mask having a pattern corresponding to the shape of the stopper film, and is developed, thereby causing the resist corresponding, to the shape of the stopper film to remain. Dry etching or wet etching is performed through the resist, and the resist is peeled, thereby forming the stopper film. In this fashion, the semiconductor layer 111 including the semiconductor film and the stopper film is thus formed.

Next, an amorphous silicon layer containing n-type dopants is deposited, and is subjected to etching by photolithography together with the microcrystal silicon film which is a lower layer thereof, thereby forming a drain region, a source region, and the semiconductor layer 111. Subsequently, conductive layers are formed by sputtering, vapor deposition, etc., and are patterned by photolithography, thereby forming the source electrode layer 109 including the source region, and the drain electrode layer 113 including the drain region.

Subsequently, the second insulating layer 108 is formed by CVD (Chemical Vapor Deposition) so as to cover the semiconductor layer 111, the source electrode layer 109, the drain electrode layer 113, and the first insulating layer 102. Next, a contact hole which is a through-hole is formed in the second insulating layer 108, and then a transparent conductive film like ITO is formed on the insulating film by sputtering, vapor deposition, etc. Thereafter, the transparent conductive film is patterned by photolithography, thereby forming the anode electrode 121, the contact part 123, the source extension electrode 125, and the contact part 127.

Next, photosensitive polyimide is applied so as to cover the anode electrode 121, the contact part 123, the source extension electrode 125, the contact part 127, and the second insulating layer 108, is exposed through a mask corresponding to the shape of the bank 133, and developed to pattern the photosensitive polyimide, thereby forming the bank 133 having an aperture.

Subsequently, an organic-compound containing liquid including a hole-injection material is applied in the aperture by, for example, a nozzle printing device which causes such liquid to successively flow. Next, the transparent substrate 101 to which the organic-compound containing liquid has been applied is heated under an ambient atmosphere to cause the solvent of the organic-compound containing liquid to vaporize, thereby forming the hole-injection layer. Note that the organic-compound containing liquid may be applied under a heated atmosphere.

Next, an organic-compound containing liquid which contains a material to be the interlayer is applied by a nozzle printing device or the like. Thereafter, the transparent substrate 101 to which the organic-compound containing liquid has been applied is heated and dried under a nitrogen atmosphere, or is heated and dried in a vacuum condition, and a residual solvent is eliminated to form the interlayer. Note that the organic-compound containing liquid may be applied under a heated atmosphere.

Subsequently, the other organic-compound containing liquid is likewise applied by a nozzle printing device or the like, is heated under a nitrogen atmosphere to eliminate the residual solvent, thereby forming a light emitting layer. The organic-compound containing liquid may be applied under a heated atmosphere.

Next, the transparent substrate 101 having the layers formed up to the light emitting layer is subjected to vapor deposition, sputtering, etc., to form the cathode electrode 135 with a two-layer structure. Thus way, the stacked body 100 is formed.

Note that the upper surface of the stacked body 100 may be pasted with an encapsulation substrate together by an encapsulation resin formed of an ultraviolet curing resin or a thermoset resin, and the encapsulation resin may be hardened by ultraviolet or heat, thereby joining the stacked body 100 and the encapsulation substrate together.

The width of the organic EL layer 131 (light emitting layer) in the main scanning direction (up-and-down direction in FIG. 5) is defined by the width of the anode electrode 131 in the main scanning direction. Moreover, the width of the organic EL layer 131 in the sub scanning direction (right-and-left direction) is defined by the distance between the two banks 133. The plural organic EL layers 131 are arranged side by side like an array along the main scanning direction.

The organic EL layer 131 emits light planarly. Some of the light emitted by the organic EL layer 131 radiates to outside of the stacked body 100 through the transmissive part 104 and the transparent substrate 101. The dimensions of the transmissive part 104 define the dimensions of a pixel. The transmissive part 104 is formed by a through-hole formed in a light blocking part (however, the first insulating layer 102 may enter the through-hole). The light blocking part blocks some of light emitted by the light emitting layer, and in the embodiment, the gate electrode 103 functions as a part of the light blocking part. Note that only a partial region of the gate electrode 103 functions as the gate electrode of the optical sensor TFT 171, but it is called the gate electrode 103 as a whole. As explained above, in the present invention, if only a part of a structural element fulfills a function originating from the name of the structural element and other part of the structural element is integrally formed of the same material as said part of the structural element, the name of the structural element as a whole may be expressed based on the function of its part. According to an embodiment of the present invention, the light blocking part may be formed at another site. Note that the semiconductor layer 111 corresponds to a light detecting region which detects light emitted by the light emitting layer.

As explained above, the stacked body 100 of the present embodiment includes the organic EL layer 131 (the same is true for other kinds of light emitting layers) and the light detecting element (optical sensor TFT 171) which detects light emitted by the organic EL layer 131, and a light detecting region of the optical sensor TFT 171 overlaps the light emitting surface of the organic EL layer 131 as viewed in the thickness direction of the organic EL layer 131. Accordingly, as the light detecting region is located right below the light emitting surface, the stacked body 100 has a structure which can efficiently measure the emitted light amount of the light emitting layer. Note that it is desirable that the light emitting surface and the light detecting region should overlap with each other so that the light emitting surface of the organic EL layer 131 completely (totally) covers the light detecting region, but according to the present invention, a term "overlapping" includes a case in which both of those partially overlap.

Moreover, as explained above, the stacked body 100 of the present embodiment further includes the transmissive part 104 where some of light emitted by the organic EL layer 131 go through, and the light blocking part (in the present embodiment, the gate electrode 103, the source electrode 109, and the drain electrode 113 of the optical sensor TFT 171) which blocks some of the light emitted by the organic EL layer 131. Moreover, the light emitting surface has a dimension in a first direction (the sub scanning direction) in the light emitting surface which is longer than a dimension in a second direction (the main scanning direction) vertical to the first direction, and the light detecting region and the transmissive part 104 are arranged in the first direction as viewed in the thickness direction of the organic EL layer 131. According to this structure, it is possible to increase the size of a channel depending on the photoelectric efficiency of the semiconductor layer to be used and the emitted light amount to be measured without changing the length of the channel of the TFT, thereby realizing an arbitrary sensitivity setting. Furthermore, it is possible to have a large light detecting region without changing the pitch between the organic EL layers 131 (the pitch between pixels). Still further, it is unnecessary to newly provide a light blocking part when the gate electrode 103, the source electrode 109, and the drain electrode 113 of the optical sensor TFT 171 serve as the light blocking part.

The light detecting region overlaps the light blocking part as viewed in the thickness direction of the organic EL layer 131, but does not overlap the transmissive part 104. Accordingly, it is possible to suppress or reduce any reduction of the light transmittance, any variation in light emission, or any interruption of the optical profile by a light detecting element all originating from emitted light which is for exposing the photo-conductor drum 513 and which goes through the optical sensor TFT 171.

Second Embodiment

The difference of the second embodiment from the first embodiment is that the gate electrode 103, the source electrode 109, and the drain electrode 113 of each optical sensor TFT 171 in the first embodiment are individually realized by a common electrode, and the charging-readout TFT 173 and the capacitor 175 are shared. Shared charging-readout TFT 273 and capacitor 275 and each optical sensor TFT 171 configure an optical sensor unit 270 as a whole (see FIG. 8). Sharing is done for all optical sensor TFTs 171 in the embodiment, but may be done for each group (e.g., a cell 41(*i*)) including plural optical sensor TFTs 171. Only the difference of the second embodiment from the first embodiment will be explained below, and the duplicated explanation will be skipped. Moreover, the same structural elements as those of the first embodiment will be denoted by the same reference numerals in FIGS. 7 to 10, and will be explained using those reference numerals.

Figure 7:
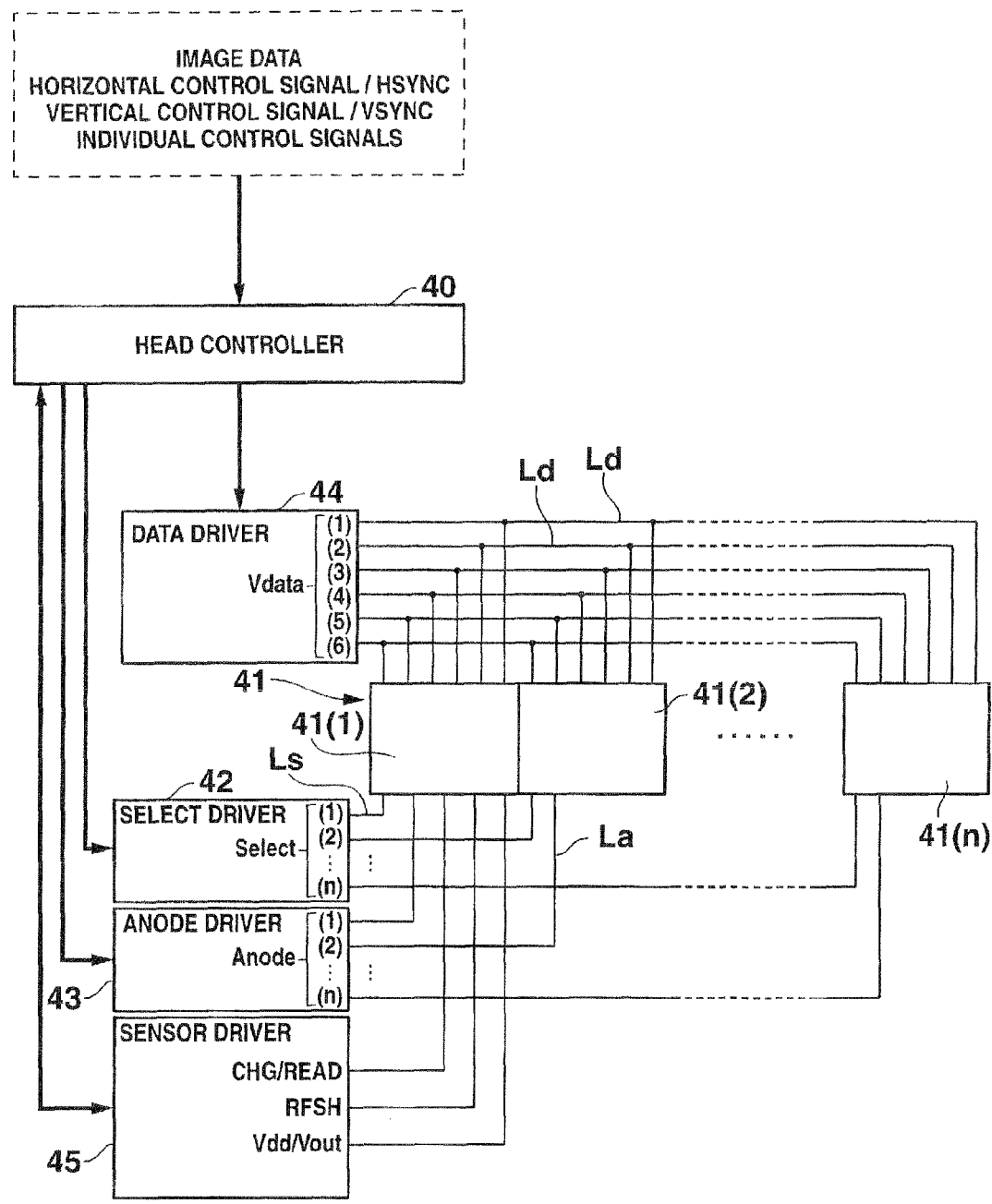
FIG. 7 is a diagram showing a schematic configuration of a light emitting device according to a second embodiment of the present invention.
Figure 9:
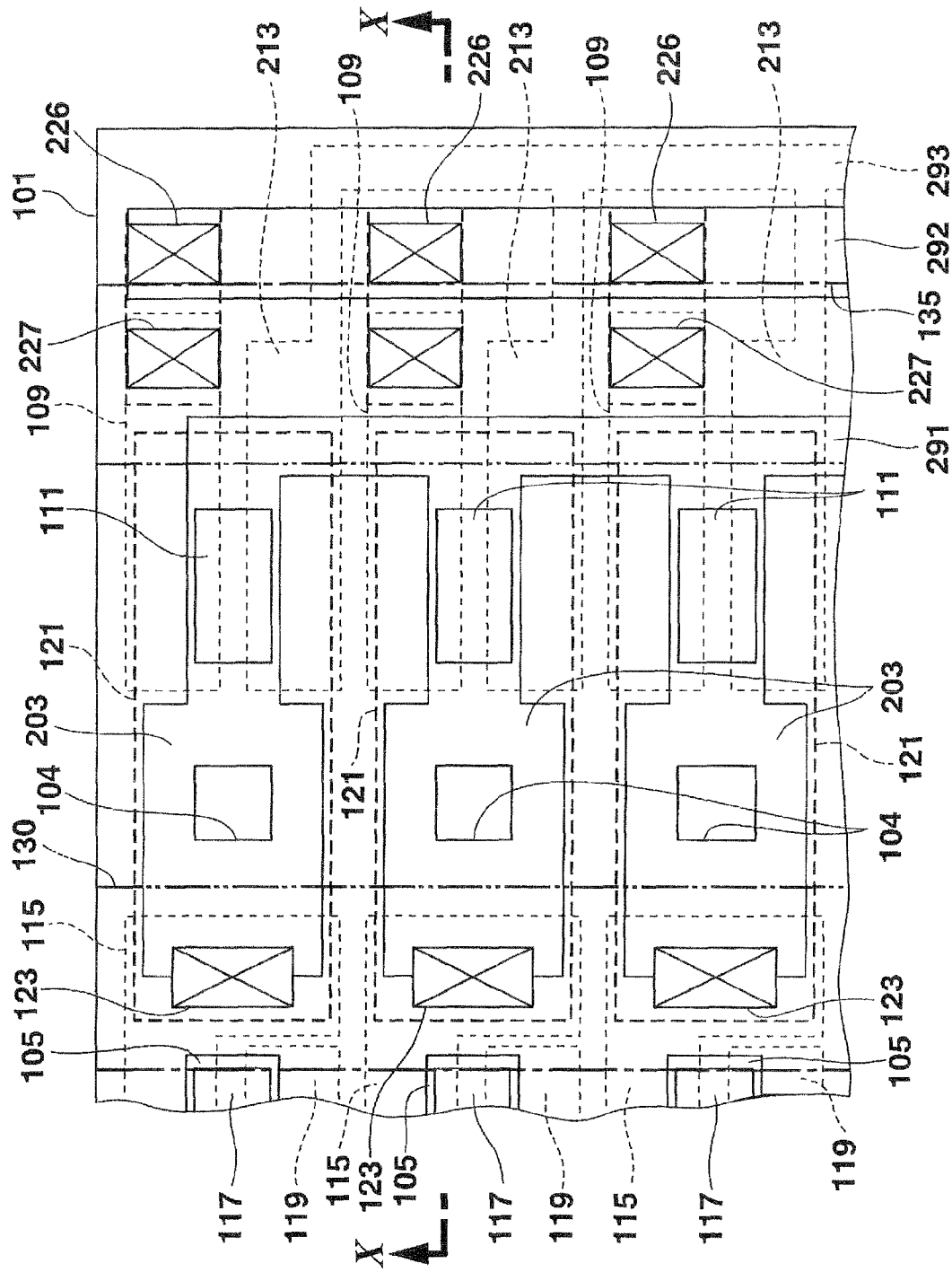
FIG. 9 is a schematic diagram showing a major part for explaining a structure of a stacked body according to the second embodiment of the present invention.
Figure 10:
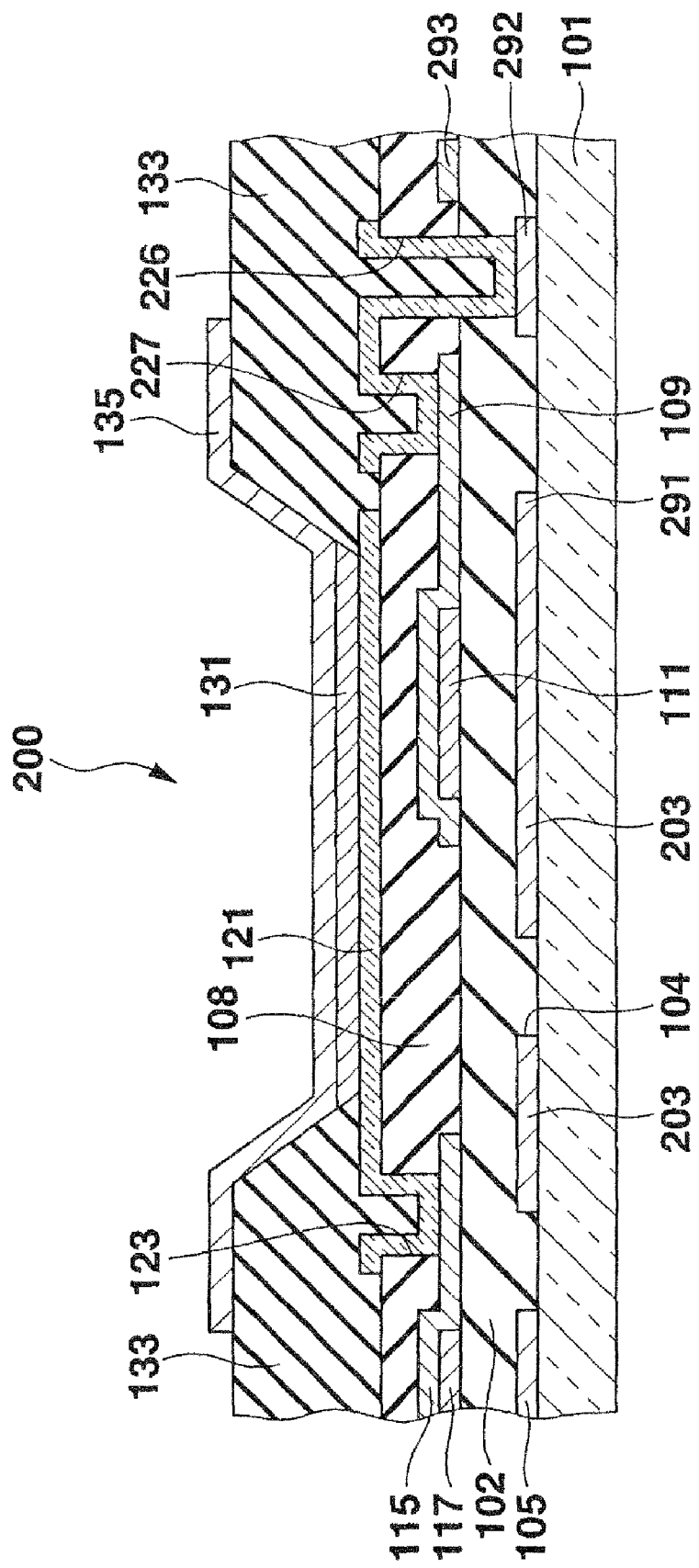
FIG. 10 is a schematic cross-sectional view showing a major part for explaining the structure of the stacked body according to the second embodiment of the present invention.

As shown in FIG. 7, in the case of the present embodiment, the number of the signal lines necessary for the sensor driver 45 to supply or receive a signal becomes one. As shown in FIGS. 9 and 10, each gate electrode 203 (corresponding to the gate electrode 103 in the first embodiment) is connected to a gate common electrode 291 and is shared. Each source electrode 109 is connected to a source common electrode 292 through contact parts 226, 227, and is shared. Furthermore, each drain electrode 213 (corresponding to the drain electrode 113 in the first embodiment) is connected to a drain common electrode 293, and is shared. Note that FIG. 10 is a cross-sectional view along a line X-X in FIG. 9.

The gate common electrode 291 is integrally formed with the gate electrode 203 from the same material as that of the gate electrode 203. The source common electrode 292 is formed separately from the gate electrode 203 but formed of the same material as that of the gate electrode 203. The contact parts 226, 227 are formed of the same material as that of the anode electrode 121 but formed separately from the anode electrode 121 and formed in a through-hole in the first insulating layer and in a through-hole in both first insulating layer and second insulating layer. The contact parts 226, 227 electrically connect the source electrode 109 and the source common electrode 292 together. The drain common electrode 293 is formed of the same material as that of the drain electrode 213 and is integrally formed with the drain electrode 213.

Figure 8:
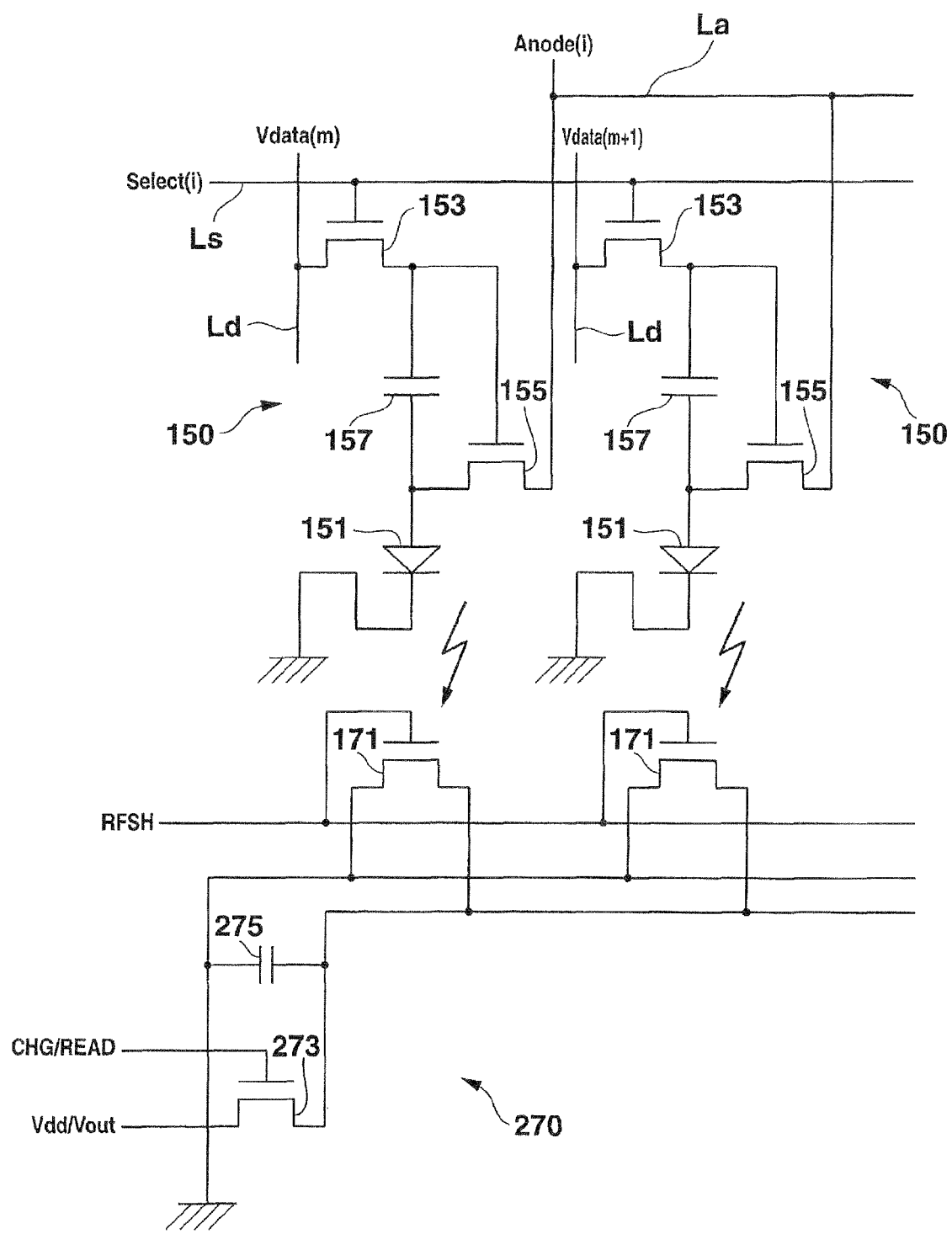
FIG. 8 is an equivalent circuit diagram for a major part of the light emitting device according to the second embodiment of the present invention.

FIG. 8 shows a circuit diagram of the present embodiment. Light emission by the light emitting unit 150 of the present embodiment is the same principle as that of the first embodiment, so that the duplicated explanation thereof will be skipped. Moreover, light detection by the optical sensor unit 270 is performed by detecting light emitted by the light emitting unit 150 one by one, and the principle thereof is same as that of the first embodiment, so that the duplicated explanation thereof will also be skipped. Note that a charging-readout TFT 273 corresponds to the charging-readout TFT 173, and a capacitor 275 corresponds to the capacitor 175.

A stacked body 200 of the present embodiment has plural light emitting layers (organic EL layers 131), and plural light detecting elements (optical sensor TFTs 171) each corresponding to each light emitting layer, and the drain electrode, the source electrode, or the gate electrode of at least a light detecting element is connected to the drain electrode, the source electrode, or the gate electrode of another light detecting element, respectively. Accordingly, the circuit wirings of the light emitting device can be remarkably reduced. Moreover, when the light emitting amount of a light emitting element, the light emitting elements are caused to emit light one by one, it is possible to detect only light detection of a light emitting element subjected to light emission, so that employing the above-explained structure of the stacked body 200 does not bring in any problem.

Third Embodiment

Figure 11:
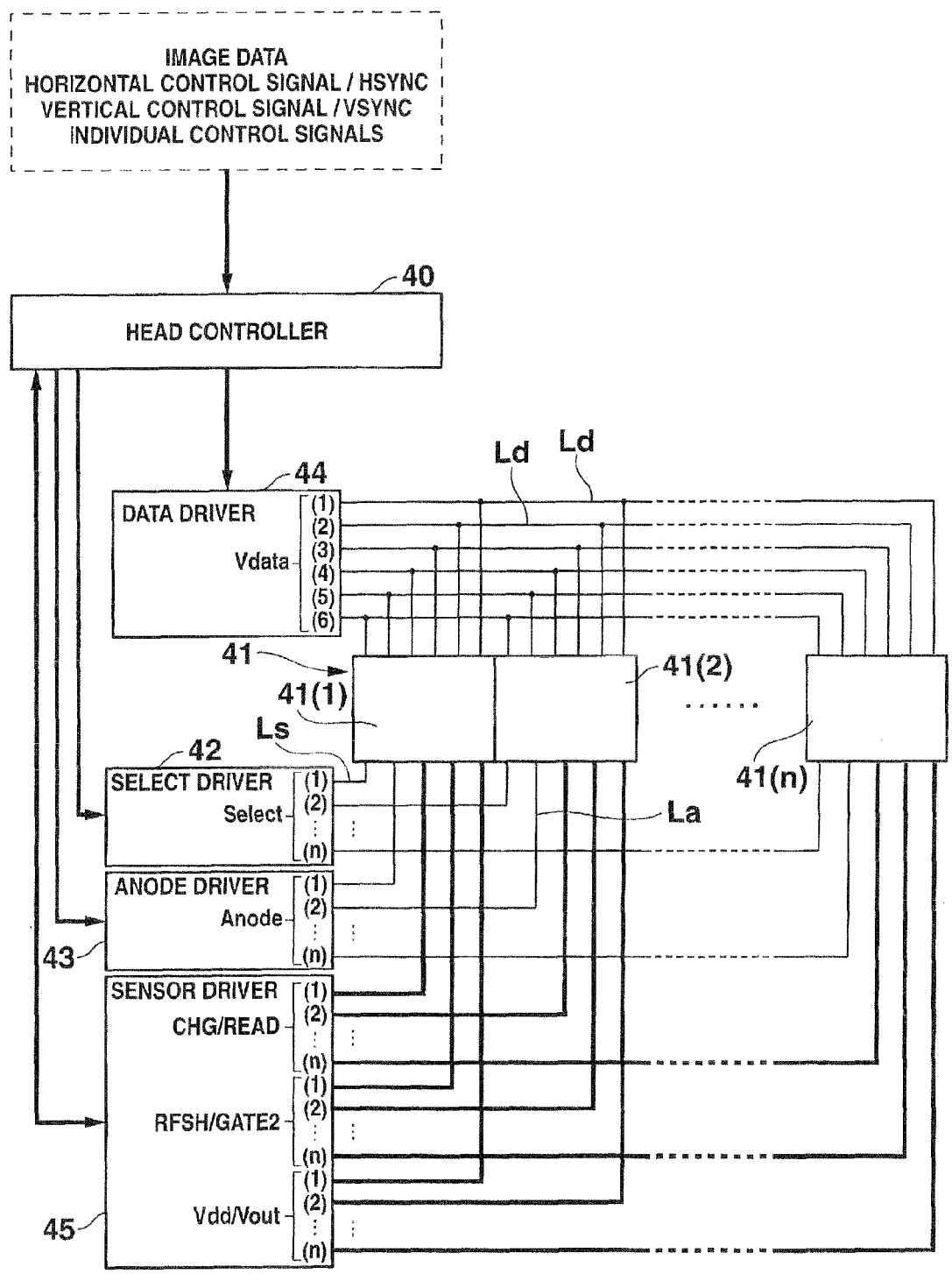
FIG. 11 is a diagram showing a schematic configuration of a light emitting device according to a third embodiment of the present invention.
Figure 12:
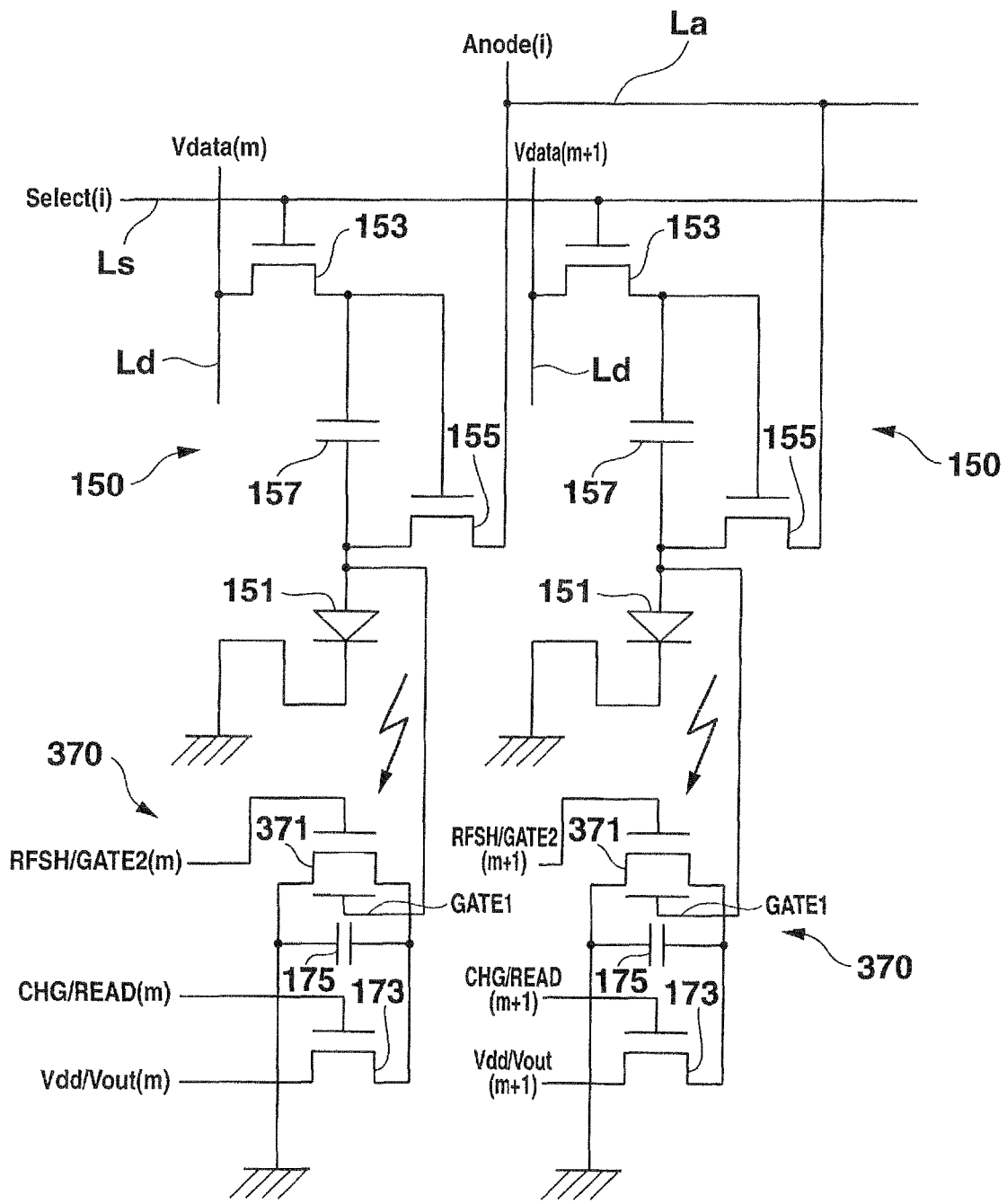
FIG. 12 is an equivalent circuit diagram for a major part of the light emitting device according to the third embodiment of the present invention.

The difference of the third embodiment from the first embodiment is that each optical sensor TFT 371 is a transistor with a double-gate structure (see FIG. 12). In this case, a stacked body of the present embodiment can employ substantially the same structure as that of the stacked body 100 of the first embodiment. Depending on how to apply a voltage, each optical sensor TFT 371 becomes a double-gate structure. Note that the optical sensor TFT 371 comprises the gate electrode 103, the first insulating layer 102, the source electrode 109, the semiconductor layer 111, the drain electrode layer 113, and the anode electrode 121, all shown in FIGS. 5 and 6. The gate electrode layer 103 and the anode electrode 121 function as a first gate and a second gate, respectively. Only the difference of the third embodiment from the first embodiment will be explained below, and the duplicated explanation will be skipped. Moreover, the same or corresponding structural elements to those of the first embodiment will be denoted by the same reference numerals in FIGS. 11 and 12, and the duplicated explanation thereof will be skipped.

As shown in FIG. 11, according to the present embodiment, when supplying a signal, the sensor driver 45 also supplies a signal GATE2. As shown in FIG. 12, one gate of the optical sensor TFT 371 is connected to the anode of the organic EL element 151. That is, the one gate functions as the anode of the organic EL element 151.

Operations from light emission to refreshing of the capacitor 175 in the circuit shown in FIG. 12 are same as those of the first embodiment, so that the duplicated explanation will be skipped.

Figure 13:
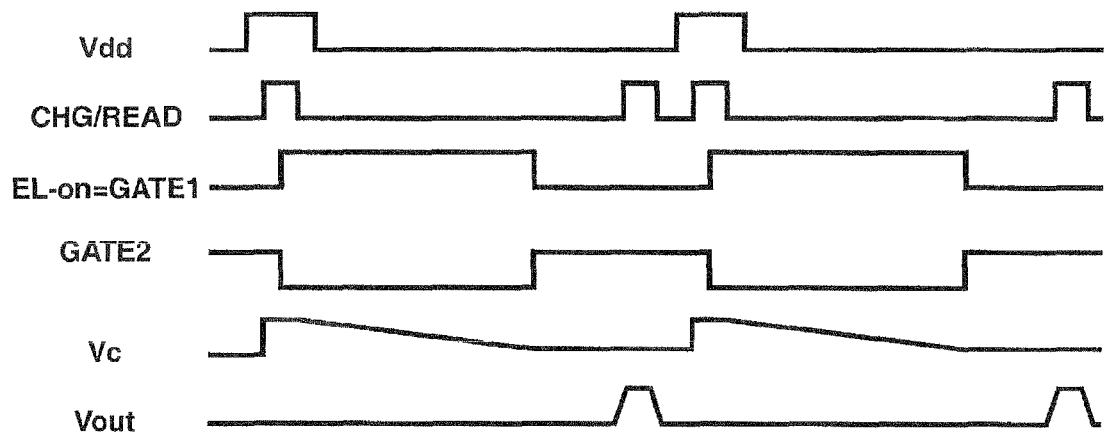
FIG. 13 is a timing chart showing a light detecting operation by the light emitting device according to the third embodiment of the present invention.

As shown in FIG. 13, a charge signal Vdd and a control signal CHG/READ both are at a High level are supplied to an optical sensor unit 370. This signal supply causes the charging-readout TFT 173 to turn on, and the capacitor 175 is charged at a voltage corresponding to Vdd. Hence, the electric potential Vc increases. The charging-readout TFT 173 turns off thereafter. Conversely, a current is supplied to the organic EL element 151, and the organic EL element 151 starts emitting light. Moreover, a voltage signal GATE1 (e.g., +10 V) applied to the organic EL element 151 and a voltage signal GATE2 (e.g., −20 V) which is an anode minus are applied to respective gates of the optical sensor TFT 371. Furthermore, the electric potential Vc (e.g., 5 V) is applied to the drain of the optical sensor TFT 371. In this condition, when the optical sensor TFT 371 is irradiated with light, a channel is formed between the drain and the source, and a drain current corresponding to the emitted light amount of the organic EL element 151 flows through such a channel, and the electric potential Vc gradually decreases. After a predetermined time elapses, the control signal CHG/READ of a High level is supplied to the charging-readout TFT 173, so that the charging-readout TFT 173 turns on again, and outputs Vout. The emitted light amount can be acquired from this Vout. When Vout is little or zero, the emitted light amount is large, and when Vout is large, the emitted light amount is little. In this fashion, the optical sensor unit 370 can detect light from the organic EL element 151, and more specifically, can measure an emitted light amount of the organic EL element 151.

According to the present embodiment, a stacked body includes an electrode layer (the anode electrode 121) for causing the light emitting layer (the organic EL layer 131) to emit light provided between the light emitting layer and the light detecting element (optical sensor TFT 371), and the electrode layer functions as the second gate electrode. This structure allows the light detecting element to have a double-gate structure, so that the sensitivity for detecting light is improved. Moreover, in a TFT structure of a light detecting element, an electric field from the anode electrode 121 of the light emitting element (organic EL element 151) affects depending on the thickness of the second insulating layer 108 and the dielectric constant thereof, and the voltage applied to the anode electrode 121. When the light emitting element is emitting light, a voltage from plus several volts to plus dozen volts or more are applied to the anode electrode 121 and an electric field is generated. When a large electric field beyond Vth is generated, a TFT forms a channel through which a current flows, but as a negative voltage is applied to a lower gate electrode of the light detecting element, the sensor structure becomes the double-gate structure, so that the sensitivity improves. Accordingly, the light emitting device has a structure which enables effective measurement of an emitted light amount of the light emitting layer.

It is appropriate if the light emitting device of the present embodiment includes the light emitting element (organic EL element 151) and the light detecting element (optical sensor TFT 371) for detecting light emitted by the light emitting element, the light detecting element (the anode electrode 121) has two gate electrodes, and either one of the two gate electrodes functions as an electrode for the light emitting element. The light emitting device having such a structure can accomplish the above-explained effect. Therefore, it is fine if the light emitting element and the light detecting region do not overlap as viewed in the film thickness direction of the light emitting element. Moreover, the light emitting element and the light detecting element are formed in the stacked body.

According to the present embodiment, one of the two gate electrodes blocks some of light emitted by the light emitting element. This structure enables effective usage of the gate electrode.

Furthermore, according to the present embodiment, the light detecting region of the light detecting element overlaps the light emitting surface of the light emitting layer as viewed in the thickness direction of the light emitting layer of the light emitting element. Accordingly, a structure which enables efficient measurement of the emitted light amount of the light emitting layer is accomplished.

Fourth Embodiment

Figure 14:
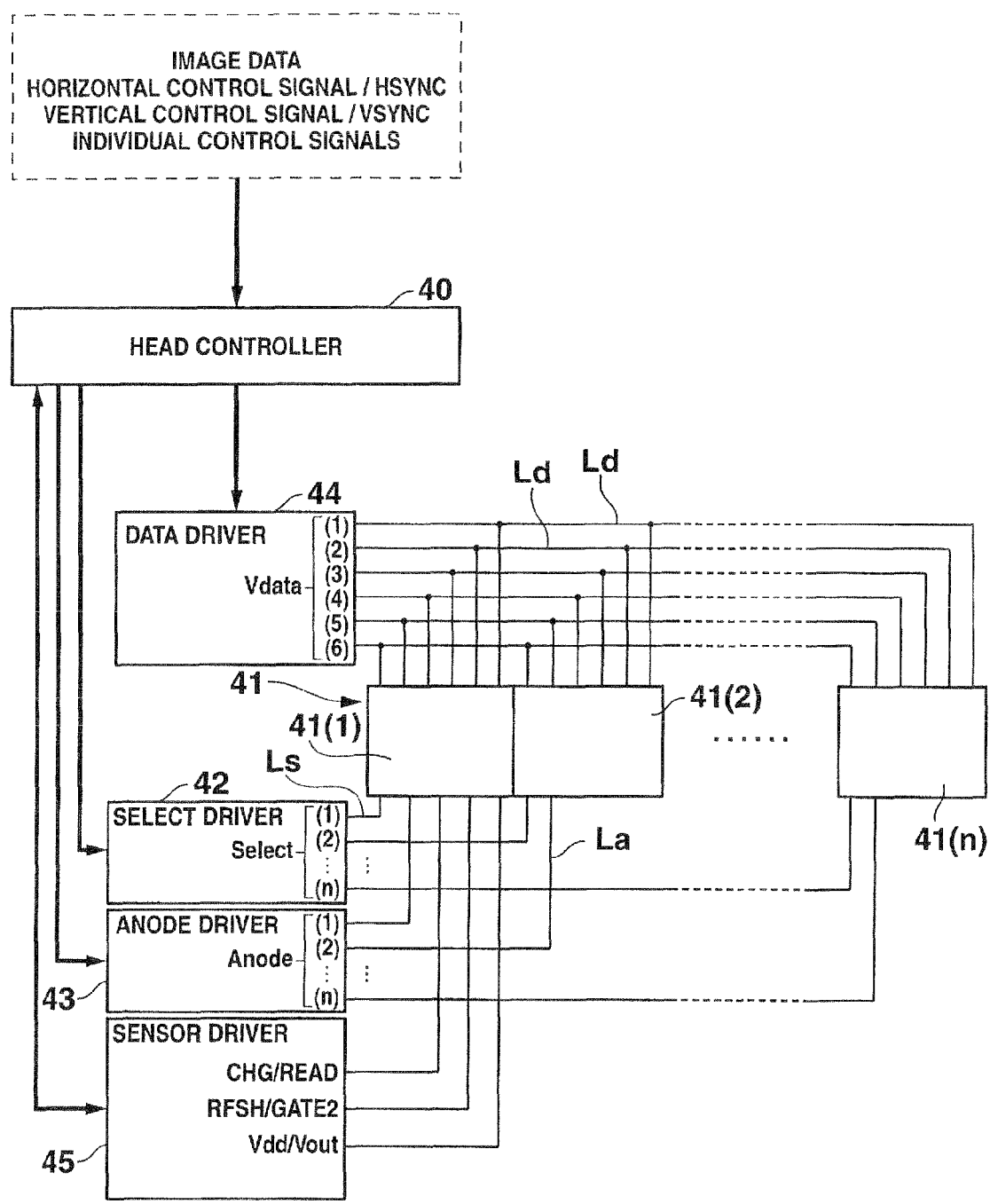
FIG. 14 is a diagram showing a schematic configuration of a light emitting device according to a fourth embodiment of the present invention.

The difference of the fourth embodiment from the third embodiment is that the gate electrode 103, the source electrode 109, and the drain electrode 113 of each optical sensor TFT 371 in the third embodiment are individually realized by a common electrode, and the charging-readout TFT 173 and the capacitor 175 are shared (see FIG. 12). That is, like the modification from the first embodiment to the second embodiment, the fourth embodiment is a modified embodiment of the third embodiment. Only the difference of the fourth embodiment from the first to third embodiments will be explained below, and the duplicated explanation will be skipped. The same or corresponding structural elements to those of the first embodiment will be denoted by the same reference numerals in FIGS. 14 and 15, and explained using those reference numerals. A stacked body or the like of the fourth embodiment can employ the same structure as that of the second embodiment. As shown in FIG. 14, in the case of the present embodiment, the number of signal lines for the sensor driver to supply or receive a signal becomes one.

Figure 15:
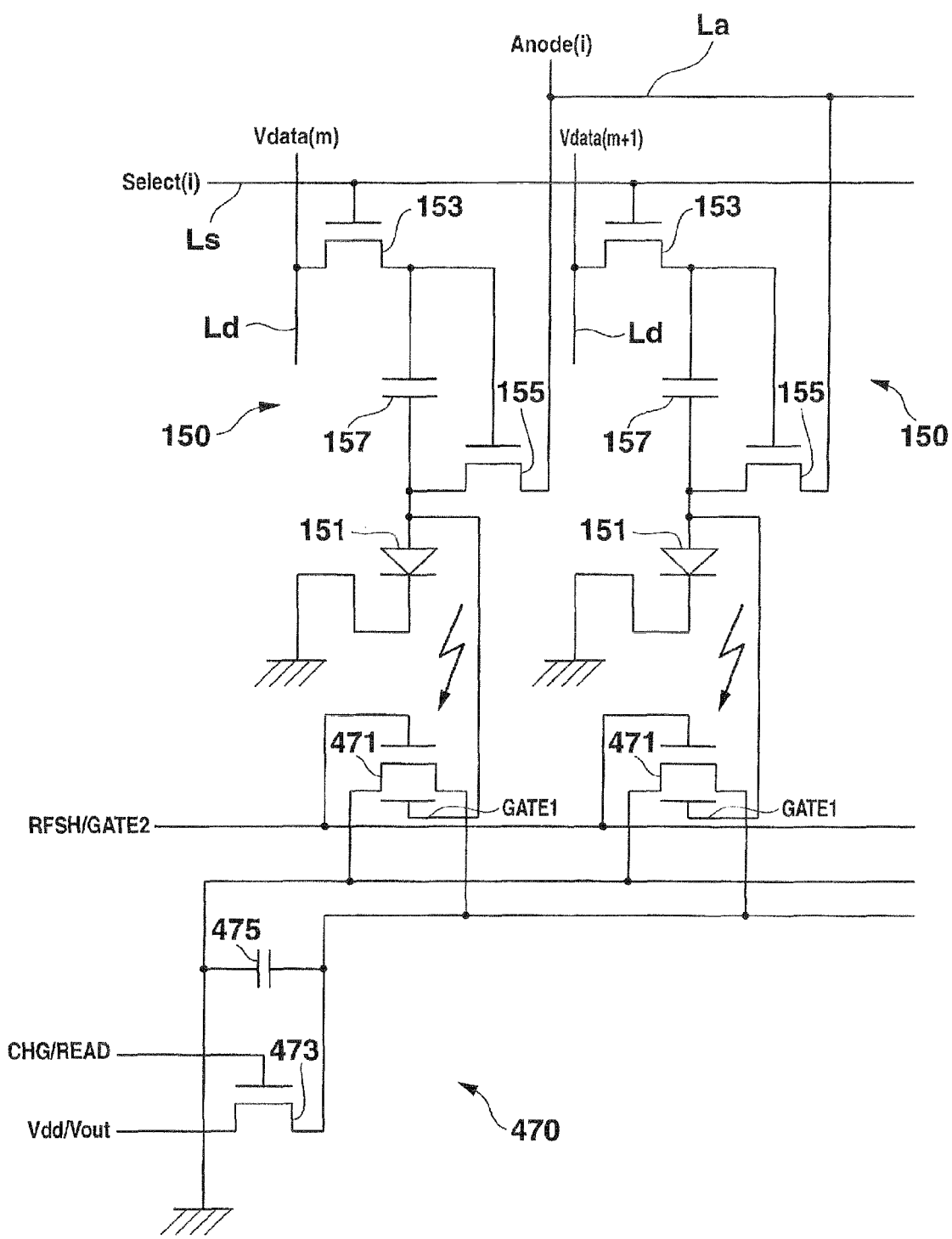
FIG. 15 is an equivalent circuit diagram for a major part of the light emitting device according to the fourth embodiment of the present invention.

FIG. 15 is a circuit diagram of the present embodiment. Light emission by the light emitting unit 150 of the present embodiment is carried out through the same principle as that of the first embodiment, so that the duplicated explanation thereof will be skipped. Moreover, light detection by an optical sensor unit 470 is performed through detection of light emission by the light emitting units 150 one by one, and the principle is same as that of the third embodiment, so that the duplicated explanation will be skipped. Note that the charging-readout TFT 473 corresponds to the charging-readout TFT 173, and a capacitor 475 corresponds to the capacitor 175.

In the present embodiment, plural light detecting elements are provided, and the gate electrodes, the source electrodes and the drain electrode of respective light detecting element are respectively and electrically connected together. This makes it possible for the light emitting device of the present embodiment to have both advantage of the second embodiment and that of the third embodiment.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A stacked body for measuring an amount of light, said stacked body comprising:
a light emitting element including a light emitting layer which emits light; and
a light detecting element including: (i) a gate electrode which comprises a transmissive part and a light blocking part, and (ii) a light detecting region which is provided between the light emitting layer and the light blocking part of the gate electrode, wherein the light detecting element detects incident light emitted by the light emitting layer,
wherein the transmissive part of the gate electrode is an opening,
wherein the light blocking part of the gate electrode includes a material which blocks incident light emitted by the light emitting layer, and
wherein the light emitting layer overlaps with the light detecting region and with the transmissive part of the gate electrode as viewed in a thickness direction of the light emitting layer such that some of the light emitted from the light emitting layer radiates onto the light detecting region and some other of the light emitted from the light emitting layer passes through the transmissive part of the gate electrode.

2. The stacked body according to claim 1, wherein a dimension of the light emitting layer in a first direction along a surface of the light emitting layer is longer than a dimension of the light emitting layer in a second direction perpendicular to the first direction, and
wherein the light detecting region and the transmissive part are adjacent to each other along the first direction as viewed in the thickness direction of the light emitting layer.

3. The stacked body according to claim 1, wherein the light detecting region overlaps with the light blocking part as viewed in the thickness direction of the light emitting layer, but does not overlap with the transmissive part.

4. The stacked body according to claim 1, wherein the light detecting element further comprises a source electrode and a drain electrode.

5. The stacked body according to claim 1, wherein the light emitting element further comprises a first electrode layer which is provided between the light emitting layer and the light detecting element and a second electrode layer which overlaps with the light emitting layer, and
wherein the first electrode layer applies a voltage to the light emitting layer and to the light detecting region such that the light emitting layer emits light and the light detecting element detects incident light.

6. The stacked body according to claim 1, wherein the light detecting element outputs an electric signal corresponding to an emitted light amount of the light emitting element.

7. The stacked body according to claim 1, further comprising a control unit, and
wherein the light detecting element outputs an electric signal corresponding to an emitted light amount of the light emitting element, and the control unit corrects a supply current to the light emitting element based on the electric signal output by the light detecting element to control a luminescence intensity of the light emitting element.

8. A light emitting device comprising the stacked body according to claim 1.

9. An image formation device comprising the stacked body according to claim 1.

* * * * *